US008227723B2

(12) United States Patent
Benson et al.

(10) Patent No.: US 8,227,723 B2
(45) Date of Patent: Jul. 24, 2012

(54) SOLDER BONDING METHOD AND APPARATUS

(75) Inventors: Eric Benson, San Francisco, CA (US); Danny Cam Lu, San Francisco, CA (US); Jeffrey S. Sullivan, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 491 days.

(21) Appl. No.: 12/581,728

(22) Filed: Oct. 19, 2009

(65) Prior Publication Data

US 2011/0089145 A1 Apr. 21, 2011

(51) Int. Cl.
*B23K 1/00* (2006.01)
(52) U.S. Cl. ...................... 219/85.22; 219/79
(58) Field of Classification Search ............. 219/85.1, 219/85.16, 85.22
See application file for complete search history.

(56) References Cited

U.S. PATENT DOCUMENTS

| | | | |
|---|---|---|---|
| 4,773,944 A | 9/1988 | Nath et al. | |
| 6,077,722 A | 6/2000 | Jansen et al. | |
| 6,256,549 B1 | 7/2001 | Romero et al. | |
| 6,265,242 B1 | 7/2001 | Komori et al. | |
| 6,288,325 B1 | 9/2001 | Jansen et al. | |
| 6,423,565 B1 | 7/2002 | Barth et al. | |
| 6,455,347 B1 | 9/2002 | Hiraishi et al. | |
| 6,784,361 B2 | 8/2004 | Carlson et al. | |
| 6,824,037 B2 * | 11/2004 | Sakai et al. | 219/85.16 |
| 6,841,728 B2 | 1/2005 | Jones et al. | |
| 6,870,087 B1 * | 3/2005 | Gallagher | 136/246 |
| 7,432,438 B2 | 10/2008 | Rubin et al. | |
| 2003/0044539 A1 | 3/2003 | Oswald | |
| 2003/0129810 A1 | 7/2003 | Barth et al. | |
| 2005/0072455 A1 | 4/2005 | Gerhardinger et al. | |
| 2005/0241692 A1 | 11/2005 | Rubin et al. | |
| 2005/0252545 A1 | 11/2005 | Nowlan et al. | |
| 2009/0188102 A1 | 7/2009 | Lu et al. | |

OTHER PUBLICATIONS

Detlev Koch-Ospelt. "End-to-End Mass Production Solutions for Gen 1 & 2 Silicon Thin Film Modules". Power Point. Jun. 13, 2007.

* cited by examiner

*Primary Examiner* — Chandra Chaudhari
(74) *Attorney, Agent, or Firm* — Patterson & Sheridan, LLP

(57) ABSTRACT

The present invention generally relates to a module and process for automatically attaching a junction box to a composite solar cell structure during the fabrication of a completed solar cell device. The electrical connection module further provides a thermode assembly including heating elements for forming a soldered connection between the junction box and the composite solar cell structure and a temperature sensing device in thermal communication with the heating elements for detecting a temperature profile during the connection process. The heating elements and temperature sensing device are linked to a controller configured to monitor and compare the energy input into the heating elements with the temperature near the tip of the heating elements throughout the connection process. The controller is further configured to compare the actual energy versus temperature profile to an expected profile throughout the connection process and verify whether a quality bond is achieved.

17 Claims, 12 Drawing Sheets

SOLDER BONDING METHOD AND APPARATUS

BACKGROUND OF THE INVENTION

1. Field of the Invention

Embodiments of the present invention generally relate to an apparatus and processes that are useful for reliably forming electrical connections in a solar cell device in a solar cell production line.

2. Description of the Related Art

Photovoltaic (PV) devices or solar cells are devices which convert sunlight into direct current (DC) electrical power. Typical thin film PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a back electrode. The photoelectric conversion unit includes a p-type silicon layer, an n-type silicon layer, and an intrinsic type (i-type) silicon layer sandwiched between the p-type and n-type silicon layers. Several types of silicon films including microcrystalline silicon film ($\mu$c-Si), amorphous silicon film (a-Si), polycrystalline silicon film (poly-Si), and the like may be utilized to form the p-type, n-type, and/or i-type layers of the photoelectric conversion unit. The backside electrode may contain one or more conductive layers.

With the current trend toward alternative energy sources, there is a need for a low cost way of producing electricity using a low cost solar cell device. Conventional solar cell manufacturing processes are highly labor intensive and have numerous interruptions that can affect production line throughput, solar cell cost, and device yield. Conventional solar cell fabrication processes include a number of manual operations that can cause the formed solar cell device properties to vary from one device to another. In typical solar cell electrical connection processes, formed electrical leads are manually positioned within a housing that is manually bonded to the solar cell. These manual processes are labor intensive, time consuming, and costly. Further, current solar cell electrical connection processes fail to ensure that robust and reliable bonds are formed absent physical destructive testing. Therefore, a need exists for an automated electrical connection module in a solar cell fabrication system that provides for non-destructive bond detection during the electrical connection process.

SUMMARY OF THE INVENTION

In one embodiment of the present invention, a solder bonding method comprises contacting an electrically conductive tab with a heating element, wherein the electrically conductive tab is in contact with an electrically conductive lead, applying power to the heating element while monitoring the amount of power applied to the heating element, measuring the temperature of the heating element during the applying power to the heating element, and determining whether an acceptable solder bond is formed between the conductive tab and the conductive lead by comparing a profile of the monitored amount of power and the measured temperature with a profile of the expected amount of power and the expected temperature.

In another embodiment, a solar cell electrical connection module comprises a vision system configured to scan a solar cell device and locate a lead on the solar cell device, a robotic gripper having gripping elements configured to pick up, manipulate, and place a junction box onto the solar cell device such that a tab of the junction box is in contact with the lead using information received from the vision system, a heating assembly comprising a heating element having a thermocouple attached thereto, wherein the heating element is configured to contact the tab, and a controller configured to apply power to the heating element while monitoring the amount of power applied to the heating element, monitor temperature readings from the thermocouple while applying power, and compare the monitored amount of power and temperature readings with expected power and temperature to determine whether an acceptable solder bond is formed between the tab and lead.

In yet another embodiment of the present invention, a method of attaching a junction box to a solar cell device comprises applying an adhesive sealant to a sealing surface of a junction box, picking up the junction box via a robotic gripper, moving a solar cell device in a first direction via a conveyor device, scanning the solar cell device with a vision system to locate exposed leads disposed on the solar cell device, moving the junction box in a second direction via a head assembly and an actuator, positioning the junction box onto the solar cell device such that electrical connection tabs within the junction box are in contact with the exposed electrical leads on the solar cell device using information provided by the vision system, positioning heating elements having temperature sensors coupled thereto in contact with the tabs using information provided by the vision system, applying power to the heating elements while monitoring the amount of power applied to the heating elements, monitoring temperature readings from the thermocouples while applying power, and determining whether acceptable solder bonds are formed between the tabs and the leads by comparing a profile of the monitored amount of power and temperature with a profile of the expected amount of power and temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to an automated solar cell electrical connection module that is positioned within an automated solar cell fabrication line and is configured to ensure a robust and reliable bond is formed during the electrical connection process. The automated solar cell fabrication line is generally an arrangement of automated processing modules and automation equipment used to form solar cell devices. The electrical connection module generally provides a module and process for automatically attaching a junction box to a composite solar cell structure during the fabrication of a completed solar cell device. The electrical connection module further provides a thermode assembly including heating elements for forming a soldered connection between the junction box and the composite solar cell structure and a temperature sensing device in thermal communication with the heating elements for detecting a temperature profile during the connection process. The heating elements and temperature sensing device are linked to a controller configured to monitor and compare the energy input into the heating elements with the temperature near the tip of the heating elements throughout the connection process. The controller is further configured to compare the actual energy versus temperature profile to an expected profile throughout the connection process and verify whether a quality bond is achieved.

Figure 1:
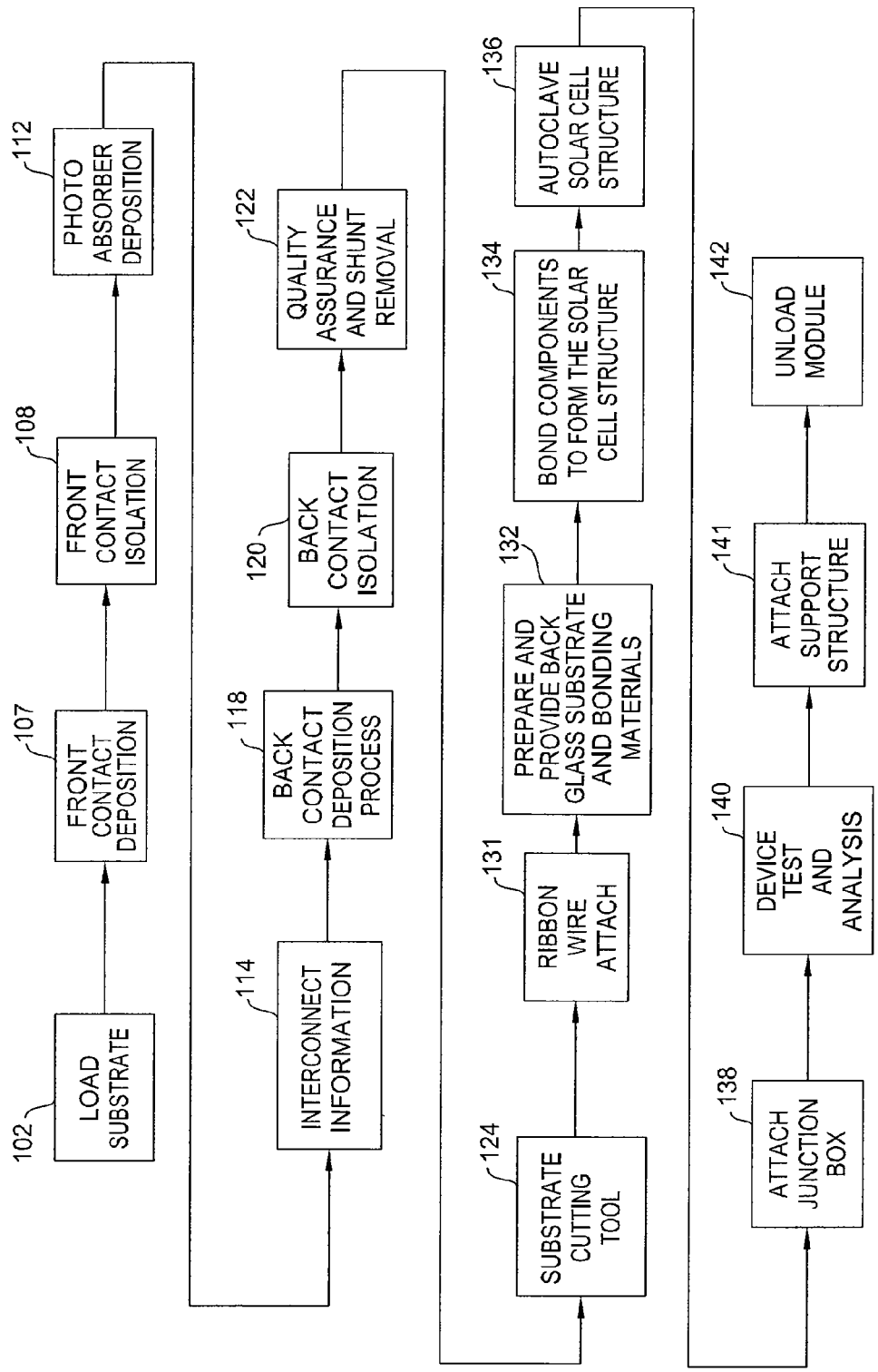
FIG. 1 illustrates a process sequence for forming a solar cell device according to one embodiment described herein.
Figure 2:
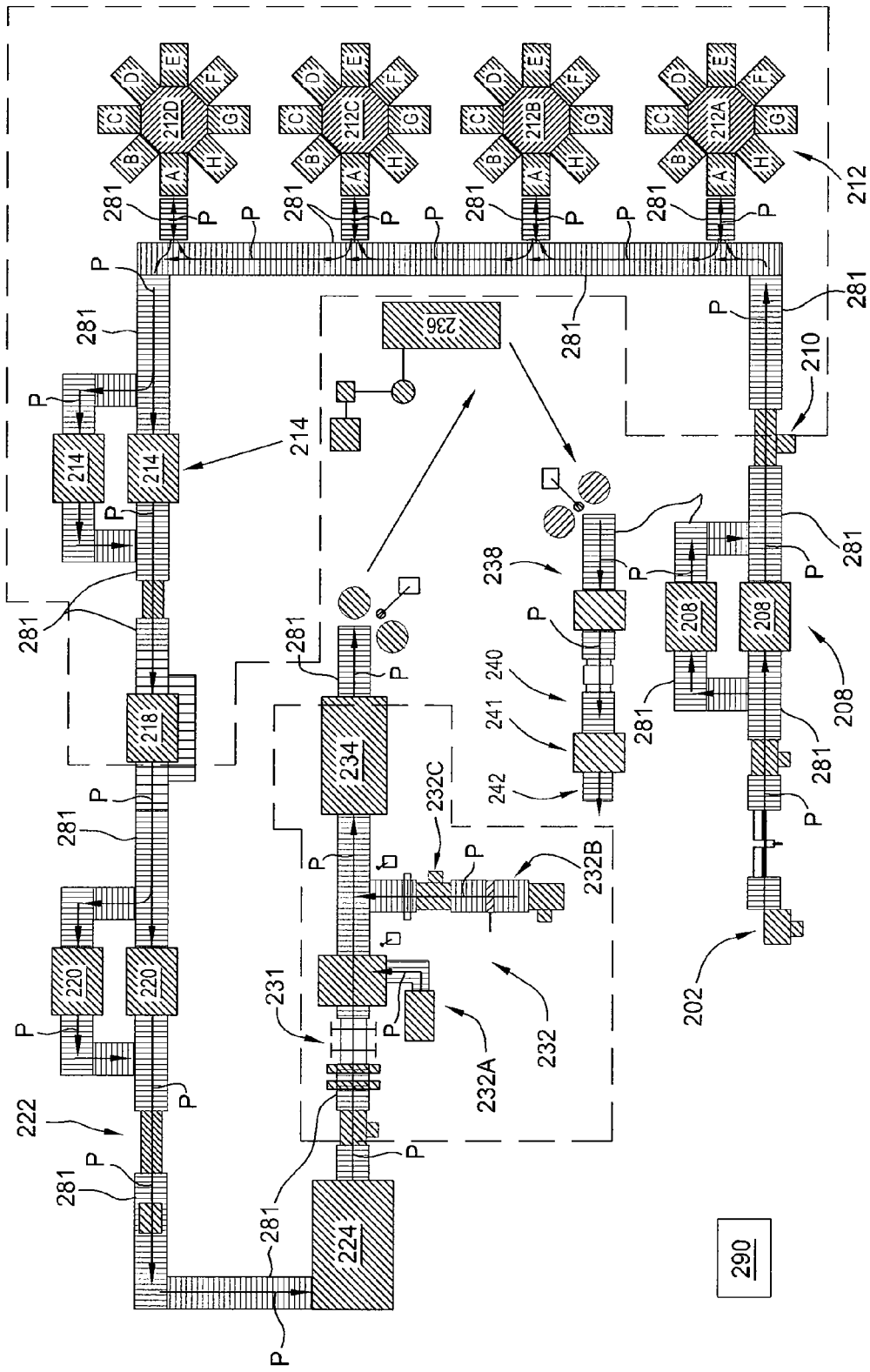
FIG. 2 illustrates a plan view of a solar cell production line according to one embodiment described herein.

FIG. 1 illustrates one embodiment of a process sequence 100 that includes a plurality of steps (i.e., steps 102-142) that are used to form a solar cell device using a solar cell production line 200 including an electrical connection module configured to perform bonding and quality assurance processes described herein. FIG. 2 is a plan view of one embodiment of the production line 200, which is intended to illustrate some of the processing modules and process flows through the system and other related aspects of the system design.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line. In another embodiment, the system controller 290 includes a plurality of local controllers (i.e., CPU, memory, support circuits) contained within one or more of the processing modules within the production line 200 for local monitoring and control of the respective module and for communicating with a higher level controller within the system controller 290.

Figure 3A:
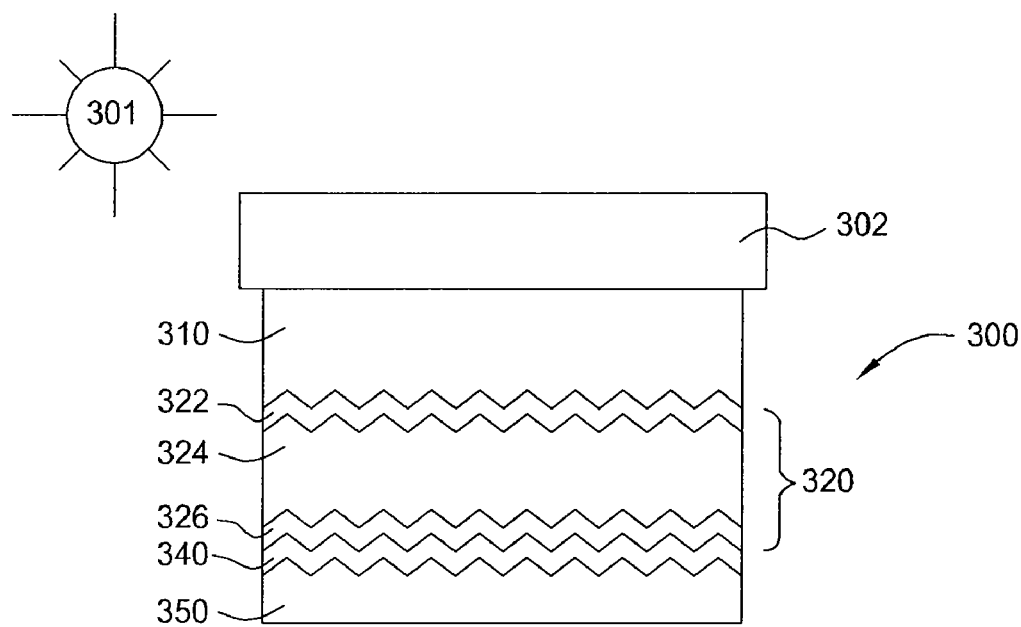
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous silicon solar cell 300 that can be formed and analyzed in the system described below.

As shown in FIG. 3A, the single junction solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340.

In one configuration, the first p-i-n junction 320 may comprise a p-type amorphous silicon layer 322, an intrinsic type amorphous silicon layer 324 formed over the p-type amorphous silicon layer 322, and an n-type amorphous silicon layer 326 formed over the intrinsic type amorphous silicon layer 324. The back contact layer 350 may include, but is not limited to, aluminum (Al), silver (Ag), titanium (Ti), chromium (Cr), gold (Au), copper (Cu), platinum (Pt), alloys thereof, or combinations thereof.

Figure 3B:
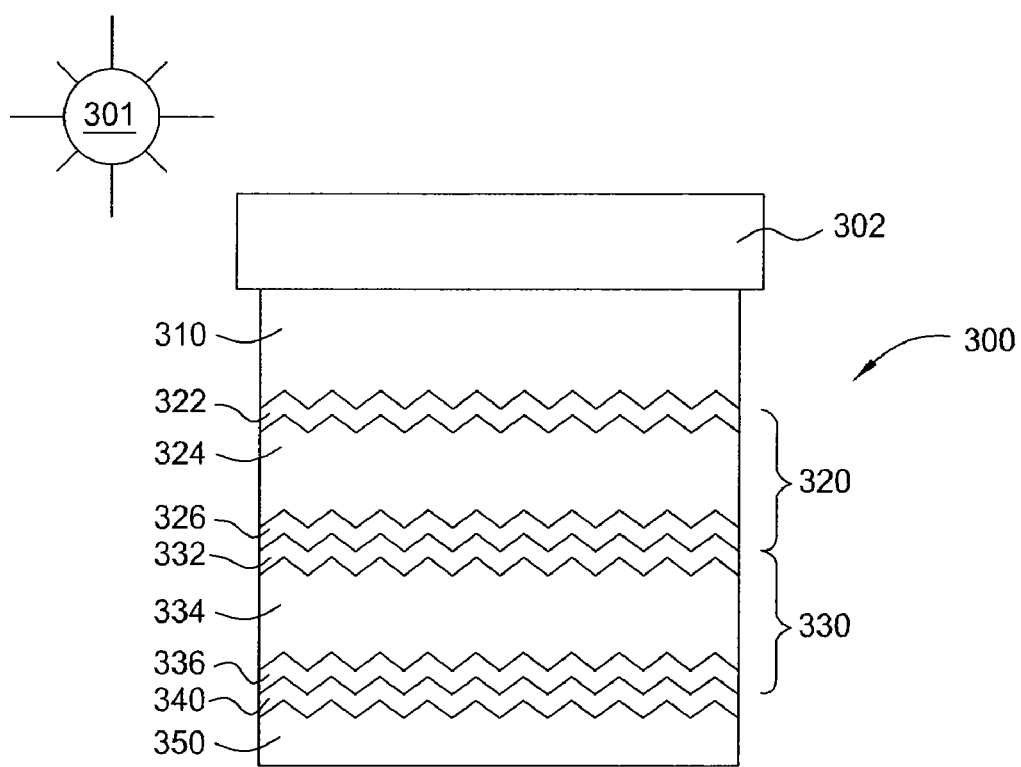
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. The back contact layer 350 may include, but is not limited to, aluminum (Al), silver (Ag), titanium (Ti), chromium (Cr), gold (Au), copper (Cu), platinum (Pt), alloys thereof, or combinations thereof.

Figure 3C:
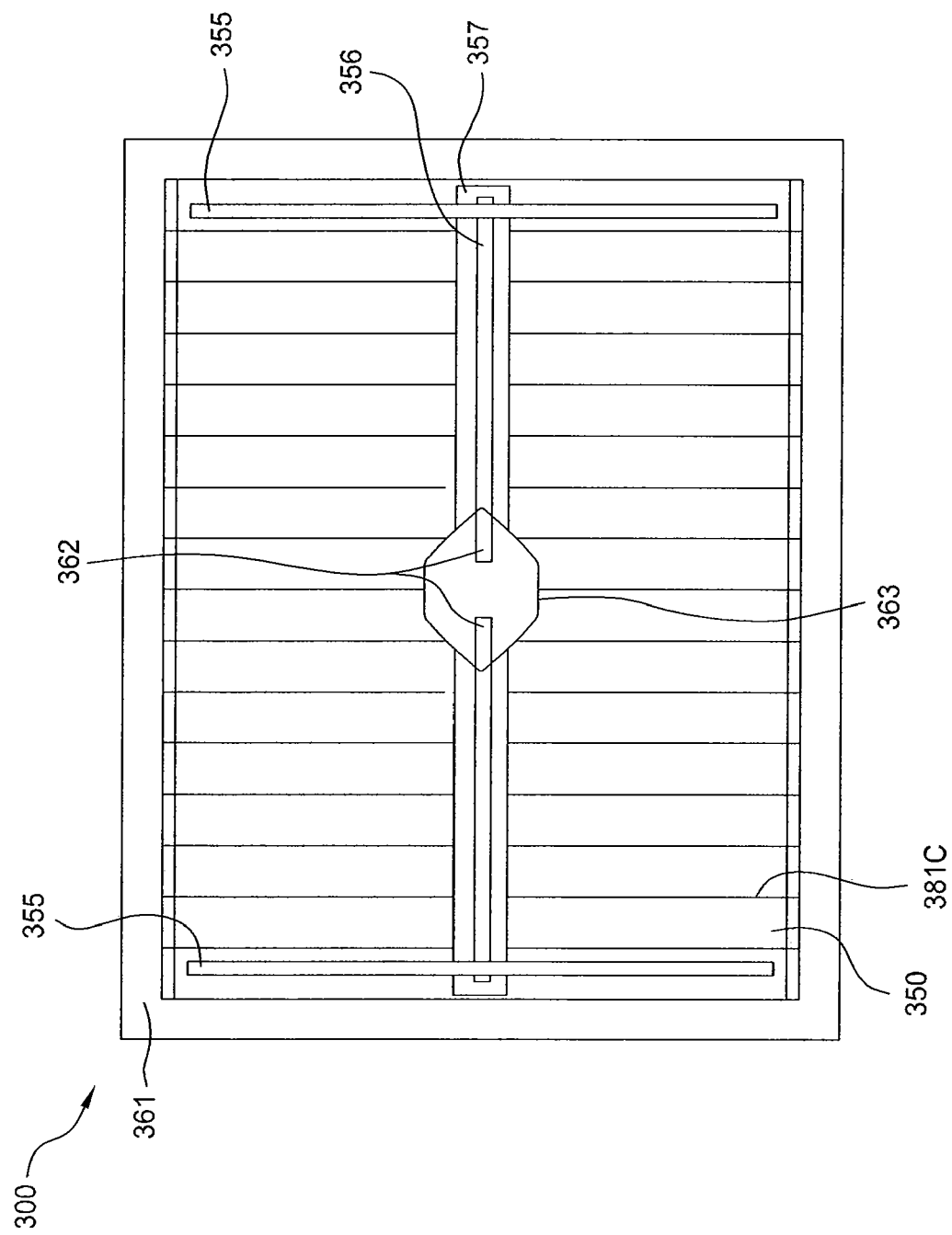
FIG. 3C is a plan view of a composite solar cell structure according to one embodiment described herein.
Figure 3D:
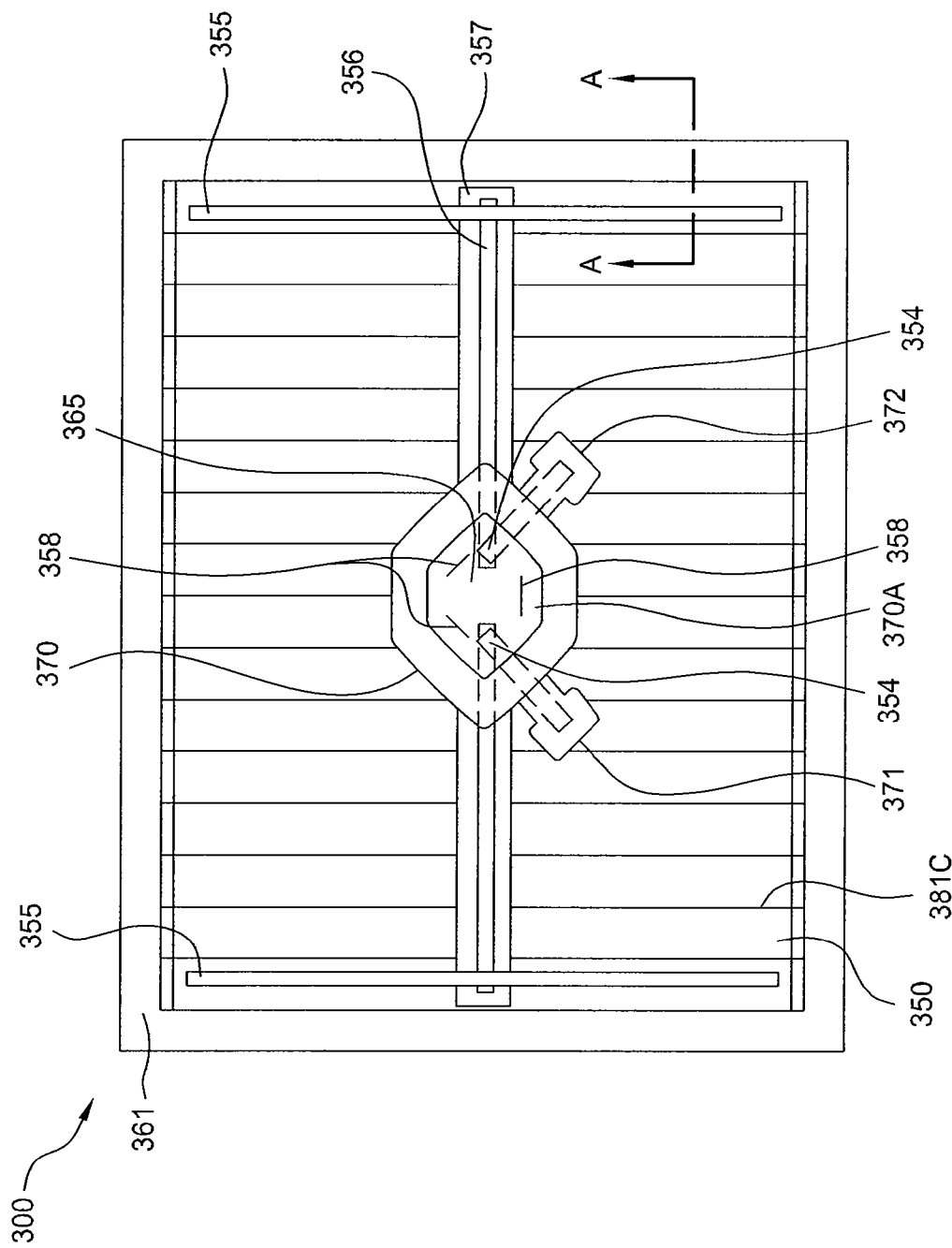
FIG. 3D is a plan view of a thin film solar cell device according to one embodiment described herein.
Figure 3E:
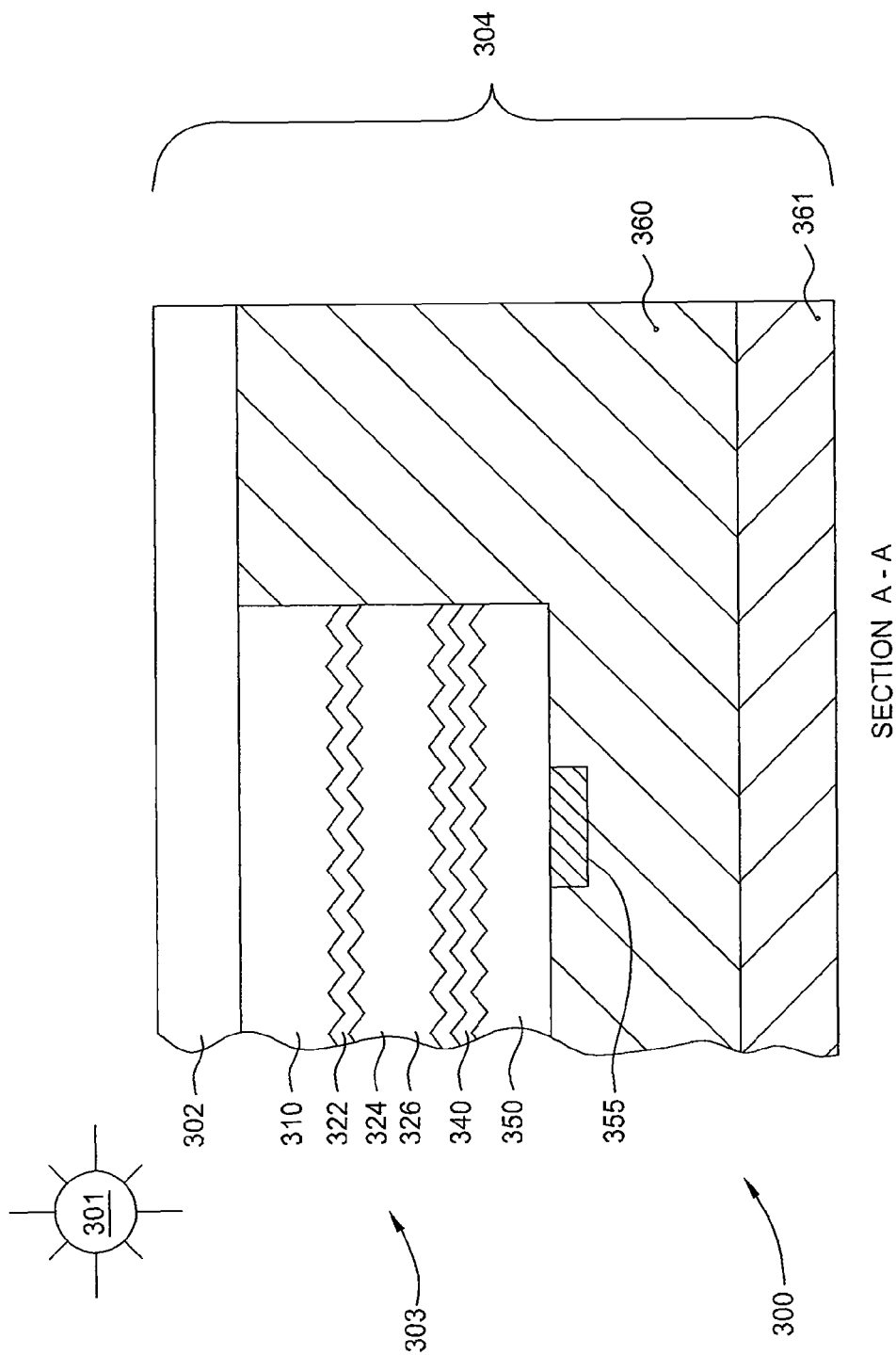
FIG. 3E is a side cross-sectional view along Section A-A of FIG. 3D.

FIG. 3C is a plan view that schematically illustrates an example of the rear surface of a formed solar cell 300 prior to the attachment of a junction box. FIG. 3D is a plan view of the rear surface of the formed solar cell 300, after the attachment of the junction box. FIG. 3E is a side cross-sectional view of a portion of the solar cell 300 illustrated in FIG. 3D (see section A-A).

As shown in FIGS. 3C, 3D, and 3E, the solar cell 300 may contain a substrate 302, the solar cell device elements (e.g., reference numerals 310-350), one or more internal electrical connections (e.g., side buss 355, cross-buss 356), a layer of bonding material 360, a back glass substrate 361, and a junction box 370 having a lid 370A.

As shown in FIG. 3C, the back glass substrate 361 may include an opening 363 for exposing leads 362 of the cross-buss 356. As shown in FIG. 3D, the junction box 370 may include two junction box terminals 371, 372 with connection tabs 354 that are electrically connected to the solar cell 300 through the side buss 355 and the cross-buss 356 via leads 362, all of which are in electrical communication with the back contact layer 350 and active regions of the solar cell 300. The junction box 370 may also include datum features 358 for use in locating, placing, and attaching the junction box as subsequently described.

To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3F:
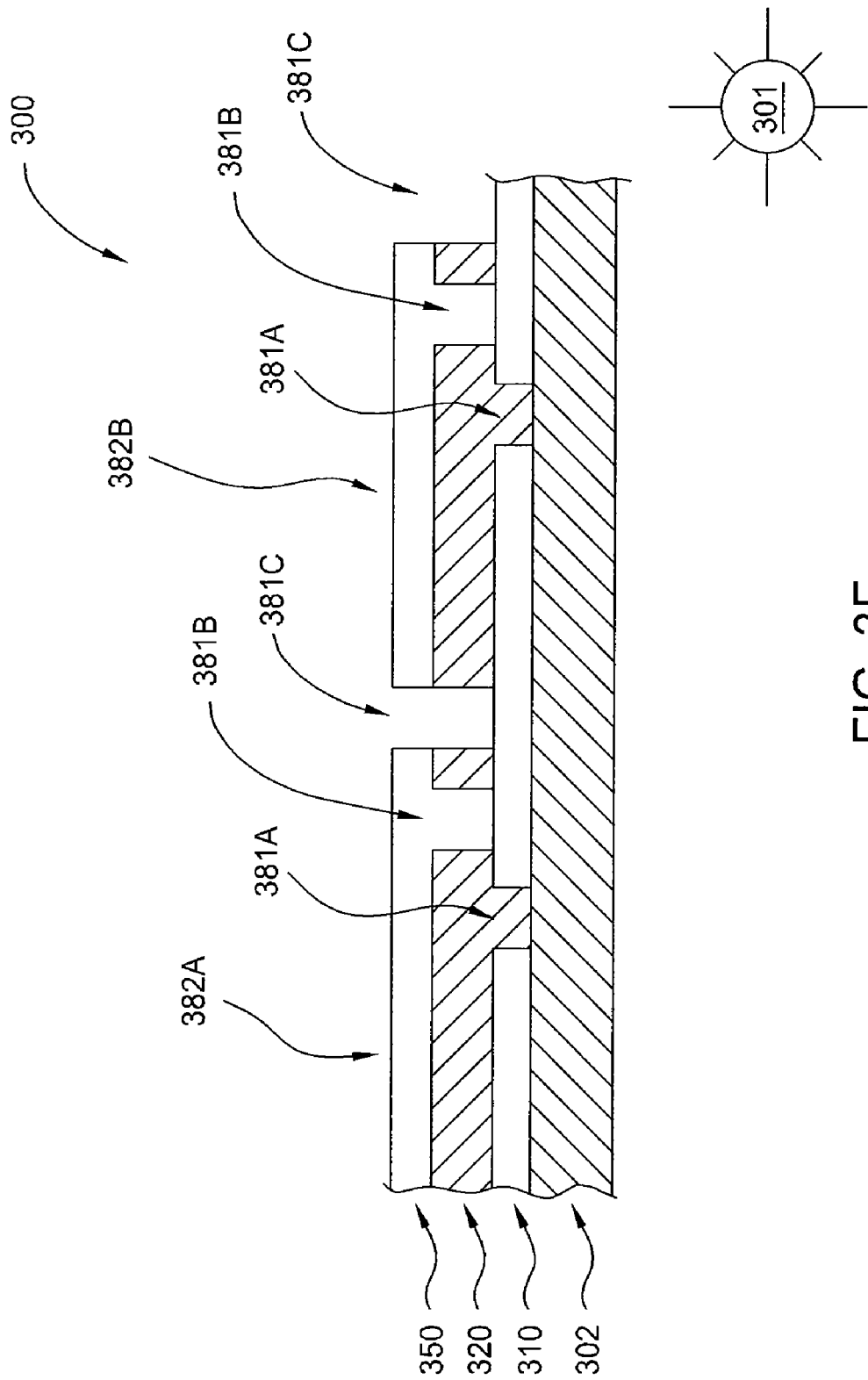
FIG. 3F is a side cross-sectional view of a thin film solar cell device according to one embodiment described herein.

FIG. 3F is a schematic cross-section of a solar cell 300 illustrating various scribed regions used to form the individual cells 382A-382B within the solar cell 300. As illustrated in FIG. 3F, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350.

General Solar Cell Formation Process Sequence

Referring to FIGS. 1 and 2, the process sequence 100 generally starts at step 102 in which a substrate 302 is loaded into a loading module 202 found in the solar cell production line 200. In one embodiment, the substrates 302 are received in a "raw" state where the edges, overall size, and/or cleanliness of the substrates 302 are not well controlled. In one embodiment, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

Referring to FIGS. 1 and 2, in one embodiment, prior to performing step 108, the substrates 302 are transported to a front end processing module (not illustrated in FIG. 2) in which a front contact formation process step 107, is performed on the substrate 302. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form a front contact layer, such as the first TCO layer 310, on a surface of the substrate 302. In one embodiment, the front end processing module is an ATON™ PVD 5.7 tool available from Applied Materials in Santa Clara, Calif. in which one or more processing steps are performed to deposit the front contact layer.

Next, the device substrate 303 is transported via an automation device 281 to a scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., individual cells 382A and 382B) that make up the solar cell 300. In one embodiment, a 5.7 m$^2$ substrate laser scribe module available from Applied Materials, Inc. of Santa Clara, Calif. is used.

Next, the device substrate 303 is transported via an automation device 281 to a processing module 212 in which step 112, which comprises one or more photoabsorber deposition steps, is performed on the device substrate 303. In one embodiment, the device substrate 303 is cleaned in a substrate cleaning module 210 prior to being transported into the processing module 212. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

Next, the device substrate 303 is transported via an automation device 281 to a scribe module 214 in which step 114, or the interconnect formation step, is performed on the device substrate 303 to electrically isolate various regions of the device substrate 303 surface from each other. In one embodiment, In one embodiment, a 5.7 m$^2$ substrate laser scribe module available from Applied Materials, Inc. is used ablate material from the substrate surface to form lines that electrically isolate one solar cell from the next. In one embodiment, the laser scribe process performed during step 114 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process.

Next, the device substrate 303 is transported via an automation device 281 to a processing module 218 in which one or more substrate back contact formation steps, or step 118, are performed on the device substrate 303. In step 118, the one or more substrate back contact formation steps may include one or more preparation, etching, and/or material deposition steps that are used to form a back contact layer, such as the back contact layer 350, of the solar cell device. In one embodiment, step 118 is performed using an ATON™ PVD 5.7 tool available from Applied Materials in Santa Clara, Calif. In another embodiment, one or more CVD steps are used to form the back contact layer 350 on the surface of the device substrate 303.

Next, the device substrate 303 is transported via an automation device 281 to a scribe module 220 in which step 120, or a back contact isolation step, is performed on the device substrate 303 to electrically isolate the plurality of solar cells located on the substrate surface from each other. In step 120, material is removed from the substrate surface by use of a material removal step, such as a laser ablation process. In one embodiment, a 5.7 m$^2$ substrate laser scribe module, available from Applied Materials, Inc., is used ablate material from the device substrate 303 surface to form lines that electrically isolate one solar cell from the next. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

Next, the device substrate 303 is transported via an automation device 281 to a quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

Next, the device substrate 303 is optionally transported via an automation device 281 to the substrate sectioning module 224 in which a substrate sectioning step 124 is used to cut the device substrate 303 into a plurality of smaller device substrates 303 to form a plurality of smaller solar cell devices. In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Next, the substrate 303 is transported via an automation device 281 to a bonding wire attach module 231 in which a bonding wire attach step 131, is performed on the substrate 303. Step 131 is used to attach the various wires/leads required to connect the various external electrical components to the formed solar cell device. In one embodiment, the bonding wire attach module 231 is used to form the side-buss 355 (FIG. 3C) and cross-buss 356 on the formed back contact region (step 118). In this configuration the side-buss 355 may be a conductive material that can be affixed, bonded, and/or fused to the back contact layer 350 found in the back contact region to form a good electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry the current delivered by the solar cell and be reliably bonded to the metal layer in the back contact region. In one embodiment, the metal strip is between about 2 mm and about 10 mm wide and between about 1 mm and about 3 mm thick.

The cross-buss 356, which is electrically connected to the side-buss 355 at the junctions, can be electrically isolated from the back contact layer(s) of the solar cell by use of an insulating material 357, such as an insulating tape. The ends of each of the cross-busses 356 generally have one or more leads 362 that are used to connect the side-buss 355 and the cross-buss 356 to the electrical connections found in a junction box 370, which is used to connect the formed solar cell to the other external electrical components.

In the next step, step 132, a bonding material 360 (FIG. 3E) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of substeps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

Next, the device substrate 303, the back glass substrate 361, and the bonding material 360 are transported to a bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side buss 355 to remain exposed so that electrical connections can be made to these regions of the solar cell structure 304 in future steps (i.e., step 138).

Next the composite solar cell structure 304 is transported via an automation device 281 to an autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360.

Next, the composite solar cell structure 304 is transported via an automation device 281 to a junction box attachment module 238 in which a junction box attachment step 138 is performed on the composite solar cell structure 304. The junction box attachment module 238, used during step 138, is used to install a junction box 370 (FIG. 3D) on the composite solar cell structure 304. The installed junction box 370 acts as an interface between the external electrical components that will connect to the formed solar cell, such as other solar cells or a power grid, and the internal electrical connections points, such as the leads 362, formed during step 131. In one embodiment, the junction box 370 contains one or more junction box terminals 371, 372 so that the formed solar cell can be easily and systematically connected to other external devices to deliver the generated electrical power. A more detailed description of an exemplary junction box attachment module 238 and exemplary processing sequences 500 and 600 for attaching the junction box 370 to the composite solar cell structure 304 is presented below in the section entitled, "Junction Box Attachment Module and Processes."

Next, the solar cell structure 304 is transported via an automation device 281 to a device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells.

Next the solar cell structure 304 is transported via an automation device 281 to a support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to an unload module 242 in which step 142, or device unload steps are performed on the substrate to remove the formed solar cells from the solar cell production line 200.

Junction Box Attachment Module and Process

The junction box attachment module 238 and processing sequence 500, performed during step 138, are used to install a junction box 370 (FIG. 3D) on a partially formed solar cell (FIG. 3C) and ensure robust electrical connections are formed therebetween. The installed junction box 370 acts as an interface between the external electrical components that will connect to the formed solar cell, such as other solar cells or a power grid, and the internal electrical connections points, such as the leads 362 of the cross-buss 356, formed during step 131. In certain embodiments of the process sequence 100, the bonding operation in step 138 may be performed without resulting in a robust mechanical bond being formed between electrical connection tabs 354 of the junction box 370 and the leads 362 of the cross-buss 356 due to a variety of factors. For instance, heating devices within the junction box attachment module 238 may not fully contact the tabs 354; solder material might not be properly or evenly distributed between the leads 362 and the tabs 354; the leads 362 and the tabs 354 may not be fully in contact; and/or the heating devices may be in contact with an unexpected heat sink during the bonding process. Although these situations may result in initial electrical contact being created between the leads 362 and the tabs 354, such that device screening (i.e., step 140) may indicate a functioning device, the mechanical bond between the leads 362 and the tabs 354 may be weak or unreliable. As a result, the electrical connection between the leads 362 and tabs 354 may be interrupted after the solar cell device is field installed due to thermal cycling of the connection during typical use. Thus, embodiments of the present invention incorporate apparatus and methods for ensuring that robust electrical and mechanical bonds are formed between the leads 362 and the tabs 354 during the junction box attachment step 138 of the process sequence 100.

Figure 4A:
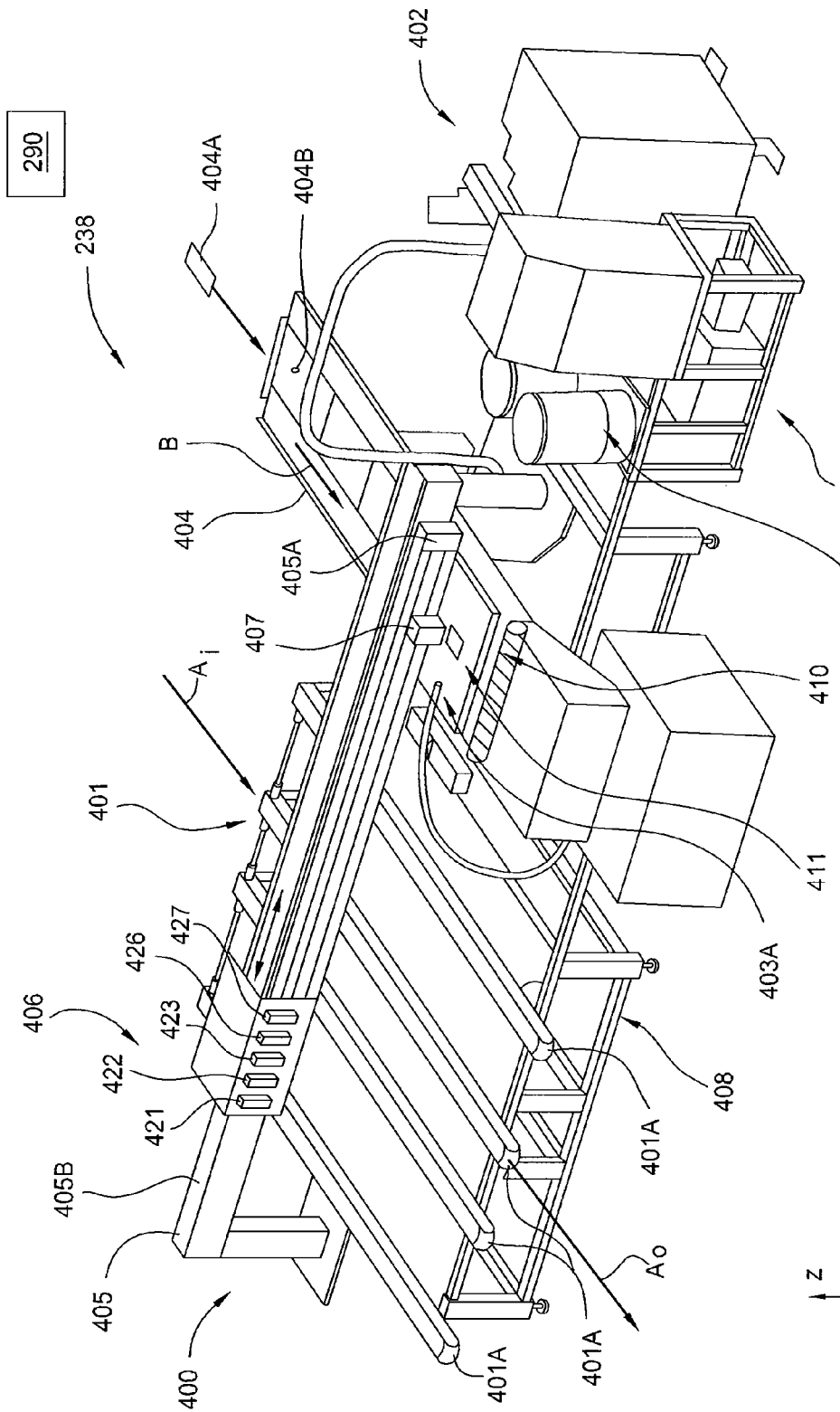
FIG. 4A is a schematic isometric view of a junction box attachment module according to one embodiment described herein.

FIG. 4A is a schematic, isometric view of an embodiment of a junction box attachment module 238 which may be useful to perform the processing sequence 500, discussed below. In one embodiment, the junction box attachment module 238 includes a main structure 400, an adhesive dispense assembly 402, a potting material dispense assembly 403, a junction box conveyor assembly 404, a gantry system 405, a head assembly 406, a flux dispense assembly 412, and a conveyor system 401, all monitored and controlled by the system controller 290. As previously set forth, a portion of the system controller 290 resides within the junction box attachment module 238, which may, alone or in combination with other portions of the system controller 290, monitor and control the various functions of the junction box attachment module 238 described herein.

In one embodiment, the main structure 400 includes a support truss, or support structure 408, that is adapted to support and retain the various components used to perform the processing sequence 500. In one embodiment, the conveyor system 401 includes a plurality of conventional conveyor belts 401A that are mounted to the support structure 408 to allow the composite solar cell structure 304 to be positioned and transferred through the junction box attachment module 238. As shown in FIG. 4A, the composite solar cell structure 304 can be transferred into the junction box attachment module 238 following path $A_i$ and exit the junction box attachment module 238 following path $A_o$.

In one embodiment, the gantry system 405, which is also supported by the support structure 408, includes structural components 405B and automation hardware that is used to move and position the head assembly 406 over the composite solar cell structure 304 that is positioned on the conveyor system 401. The gantry system 405 may include an actuator 405A, such as a servomotor controlled belt and pulley system, that is adapted to controllably position the head assembly 406 over the composite solar cell structure 304. In one embodiment, the positioning of the head assembly 406 is controlled via the system controller 290.

In one embodiment, the junction box conveyor assembly 404 is configured to receive one or more junction box components, such as junction boxes 370 and junction box lids 370A, from an operator, or an automated supply device 404A, and deliver them to a receiving region 411 of the junction box attachment module 238 in an automated fashion. Once the one or more junction box components are positioned in the receiving region 411, the head assembly 406 may receive, remove, and place these components onto the composite solar cell structure 304 positioned on the conveyor system 401 via commands sent from the system controller 290. In one embodiment, the junction box conveyor assembly 404 is adapted to receive a tray 410 of junction box components from the supply device 404A and move the tray 410 (along path "B") to the receiving region 411 using a conveyor 404B.

In one embodiment, the gantry system 405 includes a robotic arm assembly 407. The robotic arm assembly 407 may be configured to pickup a junction box 370 from the tray 410 positioned in the receiving region 411 and move the junction box 370 into a position for dispensing adhesive and flux, as discussed below.

In one embodiment, the adhesive dispense assembly 402 includes components adapted to deliver an adhesive, such as a hot melt room temperature vulcanizing (RTV) adhesive, to a section of the junction box attachment module 238, such as a nozzle in the dispense head assembly 403A, where the adhesive can be disposed upon a sealant receiving surface of the junction box 370. In one embodiment, the adhesive dispense assembly 402 is automated and is adapted to heat and dispense the adhesive material using resistive heating elements and a pressurized fluid delivery system. The pressurized fluid delivery system may use pressurized gas or other mechanical means to deliver the heated adhesive to the dispense head assembly 403A the junction box 370. In one example, the attributes of a collected image of the electrical connection tabs 354 and leads 362, which is taken after performing the attachment process, is analyzed and compared with known good process results to assure that a reliable connection has been formed. In one embodiment, the amount of exposed solder material extending past the electrical connection tabs 354 and leads 362, which can be measured by summing the number of pixels found in the collected image, is compared with known good values to assure that a good bond has been formed.

In one embodiment, the flux dispense assembly 412 includes components adapted to deliver a flux material to a section of the junction box attachment module 238, such as a nozzle in the dispense head assembly 403A, where the flux material is dispensed onto the electrical connection tabs 354 (FIG. 3D) in the junction box 370 and/or the leads 362 of the cross-buss 356 (FIG. 3C) to improve the wetting of the solder material during step 510, discussed below.

In one embodiment, the potting material dispense assembly 403 includes components adapted to deliver a potting material, such as a two part RTV material, to an internal region 365 (FIG. 3D) of the junction box 370 using a dispense nozzle 427 that has been accurately positioned over the junction box 370 and composite solar cell structure 304 by use of the gantry system 405 and commands sent from the system controller 290. In one embodiment, the internal region 365 of the junction box 370 is formed after the junction box 370 has been sealably mounted to the composite solar cell structure 304. In one embodiment, a desired amount of each of the two parts of potting material are simultaneously delivered to the internal region 365 of the junction box 370 by use of the system controller 290.

Figure 4B:
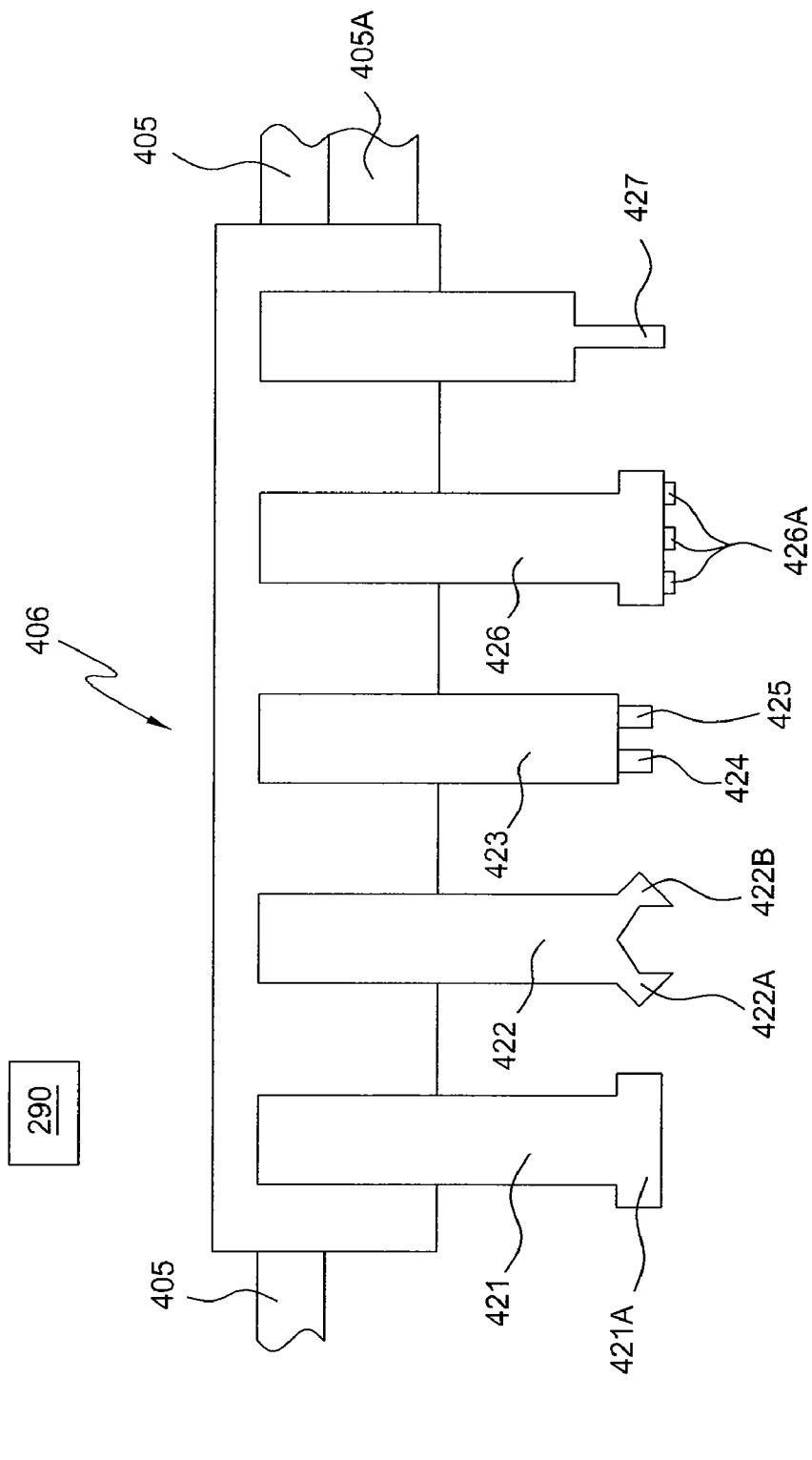
FIG. 4B is a front schematic view of on embodiment of the assembly head depicted in FIG. 4A.

FIG. 4B is an enlarged, schematic, front view of the head assembly 406 depicted in FIG. 4A. In one embodiment, the head assembly 406 includes a vision system 421, a robotic gripper 422, a thermode assembly 423, a lid retrieving robot 426, and the dispense nozzle 427. As noted above, in one embodiment, the head assembly 406 may be positioned in a desired position along the length of the gantry system 405 using an actuator 405A and the system controller 290. In one embodiment, the vision system 421 and the system controller 290 are adapted to locate one or more features on a composite solar cell structure 304 by scanning a camera 421A disposed in the vision system 421 across the composite solar cell structure 304 as the gantry system 405 moves the head assembly 406 (y-direction motion) and as the conveyor system 401 moves the composite solar cell structure 304 (x-direction motion).

In one embodiment, the vision system 421 includes a camera 421A and other electronic components that are able to locate, communicate, and store the position of features found within the formed composite solar cell structure 304. For example, the vision system 421 may be used to find the position of the exposed leads 362 of the cross-buss 356 and the opening 363 found in the back glass substrate 361 of the composite solar cell structure 304 (FIG. 3C). In another embodiment, the vision system 421 may be used for optical inspection of the soldered connection between the leads 362 of the cross buss and the electrical connection tabs 354 located in the junction box 370.

Once the desirable features on the composite solar cell substrate 304 are located by the vision system 421, a junction box 370 that has been received by the robotic gripper 422 may be positioned on the composite solar cell structure 304, and electrical connections between the junction box 370 and the composite solar cell structure 304 may be reliably made as discussed below. In one embodiment, the robotic gripper 422 includes gripping elements 422A, 422B adapted to mate with two or more datum surfaces 358 (FIG. 3D) located on the junction box 370. In one embodiment, the robotic gripper 422 is mounted on the head assembly 406 to pickup the junction box 370 from the robotic arm assembly 407 and accurately place the junction box 370, using the datum surfaces 358, from commands sent by the system controller 290 based on positional information received by the vision system 421.

In one embodiment, the thermode assembly 423 includes two or more thermal devices that are used to deliver heat to form a good electrical connection between the leads 362 of the cross-buss 356 (FIG. 3C) and the electrical connection tabs 354 located in the junction box 370 (FIG. 3D). In operation, the thermode assembly 423 and the composite solar cell structure 304 are positioned so that the electrical connection tabs 354 in the junction box 370 receive enough heat to cause any solder and flux material, disposed on the electrical connection tabs 354 and/or the leads 362 to reflow and form a robust electrical connection. In one embodiment, the thermode assembly 423 is electrically grounded to dissipate any electrical energy that may be present in the composite solar cell structure 304.

Figure 4C:
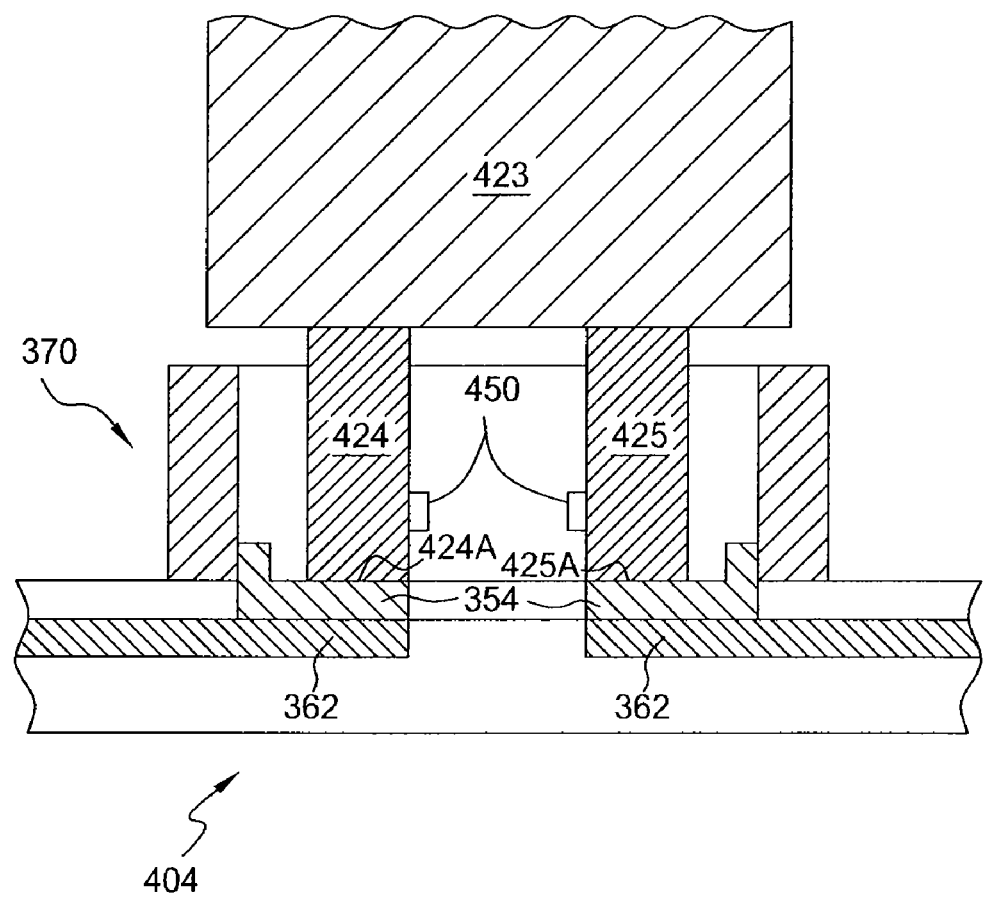
FIG. 4C is a schematic, cross-sectional view of the thermode assembly depicted in FIG. 4B in position to bond junction box tabs to leads of a solar cell device.

FIG. 4C is a schematic, cross-sectional view of the thermode assembly 423 in position to bond the electrical connection tabs 354 of the junction box 370 with the leads 362 of the cross-buss 356. In one embodiment, the thermode assembly 423 includes two elements 424, 425, such as resistive heating elements, adapted to simultaneously contact the two electrical connection tabs 354 and form an electrical connection between the two electrical connection tabs 354 and the two leads 362 by heating and causing reflow of the solder located therebetween. In one embodiment, the thermode assembly 423 includes a temperature sensor 450, such as a thermocouple, coupled to each of the elements 424 and 425 for measuring the temperature of the elements 424 and 425 and communicating the temperature of the elements to a local portion of the system controller 290 contained within the junction box attachment module 238. In one configuration, the temperature sensors 450 are coupled to the elements 424 and 425 as close to the tips 424A and 425A of the elements 424 and 425 as possible without interfering with the bonding process. In this configuration, the temperature sensors 450 are able to measure the temperature of the tips 424A and 425A before, during, and after the bonding process. Further, the local portion of the system controller 290 is further configured to monitor the energy, or power, provided to each of the elements 424 and 425 before, during, and after the bonding process and compare it with the temperature measurements at the tips 424A and 425A as a function of time. The system controller 290 may create profiles of energy input into the elements 424 and 425 versus temperature of the tips 424A and 425A corresponding to specific time sequences within the bonding operation, such as initial heating, steady state bonding, and cool down time sequences. The system controller 290 is configured to compare these acquired profiles within the specific time sequences with expected profiles within the specific time sequences and, based on that comparison, indicate whether an acceptable bond is formed.

In one embodiment, the lid retrieving robot 426 is adapted to receive the junction box lid 370A from the receiving region 411 and position it over the junction box 370 after all of the electrical connections have been made and the potting material has been positioned within the internal region 365 of the junction box 370. The lid retrieving robot 426 may include one or more vacuum end-effectors 426A that are adapted to receive and hold the junction box lid 370A as the lid retrieving robot 426 is maneuvered over the junction box 370 via the head assembly 406, the gantry system 405, and the system controller 290.

Figure 5:
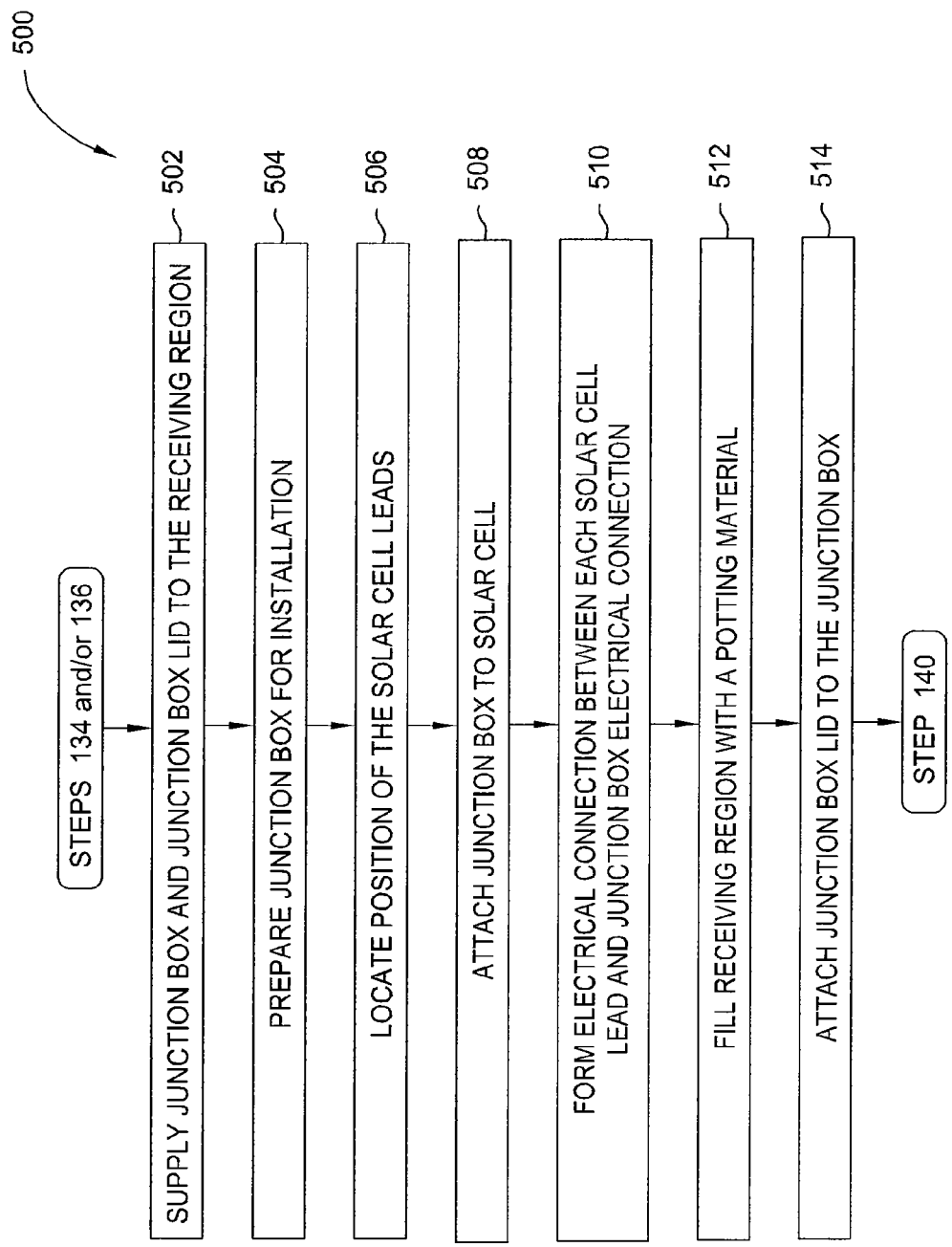
FIG. 5 illustrates a processing sequence according to one embodiment described herein.

Referring to FIGS. 1, 4A-4C and 5, in step 138, a processing sequence 500 is used to complete the junction box attachment process. FIG. 5 illustrates one embodiment of a processing sequence 500 that includes a plurality of steps (i.e., steps 502-514) that are used to form an electrical connection to a solar cell device. The configuration, number of processing steps, and order of the processing steps in the processing sequence 500 are not intended to be limiting to the scope of the invention described herein.

In one embodiment, the processing sequence 500 generally begins at step 502 in which one or more junction boxes 370 and/or one or more junction box lids 370A are moved to the receiving region 411 of the junction box attachment module 238 using the conveyor assembly 404, discussed above.

In step 504, the junction box 370 is prepared for installation on the composite solar cell structure 304 that has been processed up through steps 134 and/or 136 of the process sequence 100, discussed above. During step 504 an adhesive material, such as a hot melt RTV adhesive, is disposed on a sealant receiving surface of the junction box 370. In one embodiment, the robotic arm assembly 407 receives the junction box 370 from the tray 410 positioned in the receiving region 411 and moves the junction box 370 to the dispense head assembly 403A, which dispenses the adhesive via a nozzle on the sealant surface of the junction box 370. In one embodiment of step 504, a flux material is applied to each of the electrical connection tabs 354 via another nozzle in the dispense head assembly 403A as well.

In step 506, the vision system 421 in conjunction with the gantry system 405, head assembly 406, conveyor system 401, and system controller 290 scans the composite solar cell structure 304 to locate the leads 362 of the cross-buss 356 and the opening 363 formed in the back glass substrate 361. In one embodiment, a camera 421A within the vision system 421 and the system controller 290 are used to automatically locate and store the position of the leads 362 and the opening 363 so that the other robotic components in the junction box attachment module 238 can reliably perform the remaining attachment steps.

In step 508, the junction box 370 is disposed on the composite solar cell structure 304, which is positioned on the conveyor system 401 so that the adhesive material on the sealant receiving surface can form a seal around the opening 363 contained in the back glass substrate 361. In one embodiment, during step 508 the junction box 370 is picked-up by the robotic gripper 422 from the robotic arm assembly 407, and accurately oriented and positioned over the leads 362 of the cross-buss 356 and the opening 363 by use of the information received by the vision system 421 during step 506. In one embodiment, the gripping elements 422A, 422B of the robotic gripper 422 receive the datum surfaces 358 on the junction box 370 to provide for the correct alignment and orientation of the junction box 370 with respect to the leads 362 and the opening 363. In one embodiment, the robotic gripper 422 urges the junction box 370 and adhesive material against the surface of the back glass substrate 361 during installation. The urging force may be sufficient to obtain an even spread of adhesive material as well as obtain good contact between the leads 362 and the electrical connection tabs 354.

In step 510, the thermode assembly 423 is positioned (X, Y and Z directions) to deliver heat to the leads 362 of the cross-buss 356 and the electrical connection tabs 354 in the junction box 370 to form a robust electrical connection. In one embodiment, the heating elements 424, 425 of the thermode assembly 423 simultaneously contact and apply heat to the electrical connection tabs 354 sufficient to cause the solder material and flux located between the leads 362 and the electrical connection tabs 354 to reflow and form a reliable and robust electrical connection between the junction box 370 and the composite solar cell structure 304.

Figure 6:
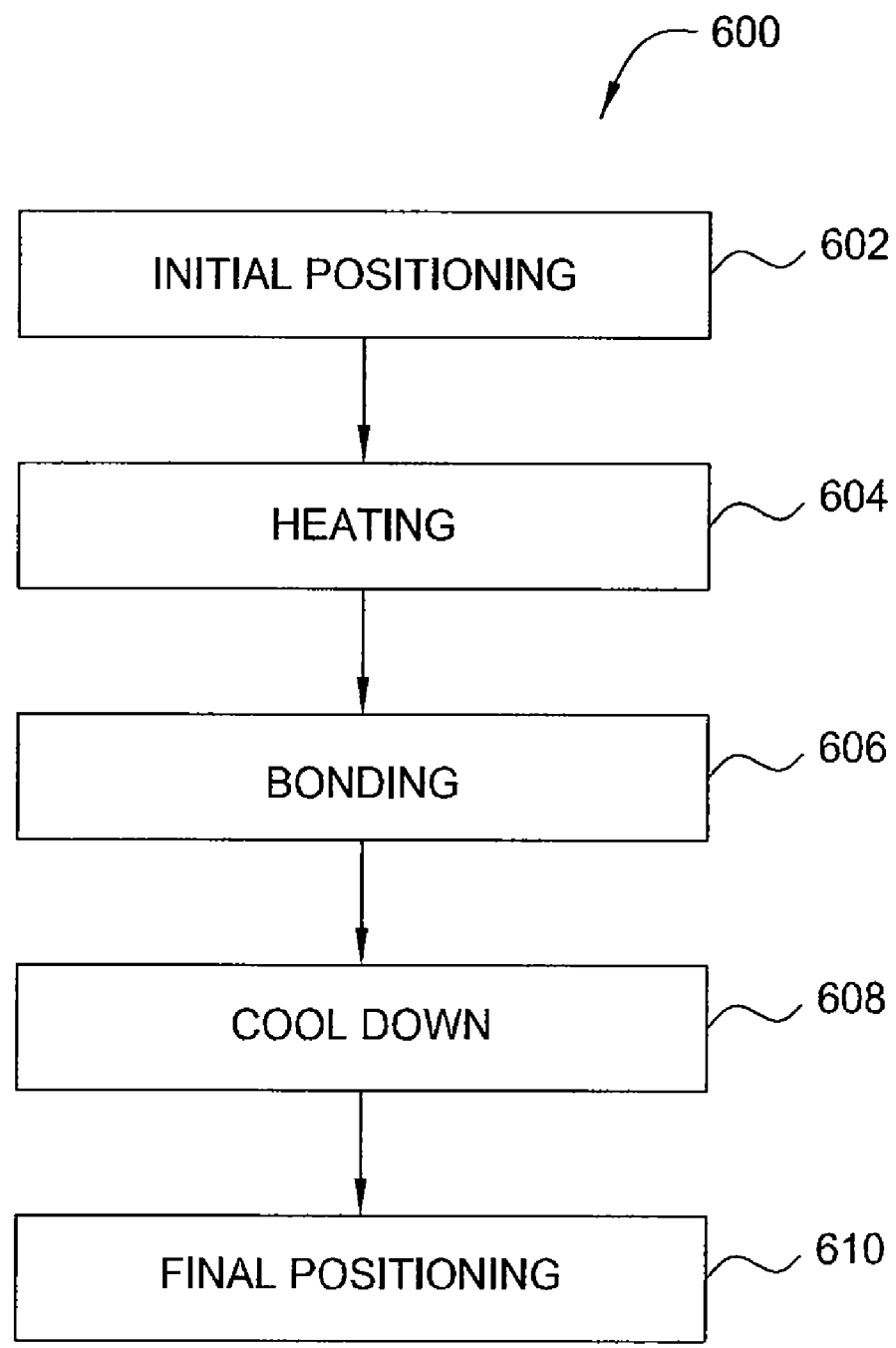
FIG. 6 illustrates a processing sequence for assuring a quality solder bond according to one embodiment described herein.

FIG. 6 illustrates a process sequence 600 used to perform the bonding operation of step 510. Referring to FIGS. 4C and 6, the thermode assembly 423 is first lowered such that the heating elements 424 and 425 simultaneously contact the electrical connection tabs 354 of the junction box 370 in an initial positioning step 602.

In a heating step 604, electrical power to the heating elements 424 and 425 is ramped up in order to heat the elements 424 and 425 up to a desired bonding temperature as measured by the temperature sensors 450 located on the heating elements 424 and 425. In one embodiment, the system controller 290 continuously monitors and tracks the temperature measured by the temperature sensors 450 as well as the amount of power applied to the elements 424 and 425 for the duration of the heating step 604. The system controller 290 then compares a profile of the input power versus temperature obtained during the heating step 604 to an expected profile of input power versus temperature for an established, acceptable heating step 604. The system controller 290 then determines whether the heating step 604 was within desired parameters as provided by the comparison. In one embodiment, an expected power input for heating each heating element from an initial temperature of between about 50° C. and about 300° C. to a bonding temperature of between about 350° C. and about 800° C. is between about 25 W and about 500 W over a time period of between about 0.05 s and about 1 s. For example, an expected power input for heating each heating element from an initial temperature of about 50° C. to a bonding temperature of between about 400° C. and about 500° C. is between about 300 W and about 400 W over a time period of about 0.5 s. If the actual power input during the heating step 604 is outside of the expected parameters, the system controller 290 may indicate that a problem exists that may prevent a good solder bond from being achieved between the electrical connection tabs 354 of the junction box 370 and the leads 362 of the cross-buss 356. For example, if less than full contact between the elements 424, 425, the electrical connection tabs 354, and the leads 362 exists, the elements 424, 425 may heat up very quickly with less power than expected indicating that a good bond may not be achievable between the electrical connection tabs 354 and the leads 362.

In a bonding step 606, electrical power to the heating elements 424 and 425 is provided at a substantially steady state to maintain the elements 424 and 425 at a desired bonding temperature during the bonding process as measured by the temperature sensors 450 located on the heating elements 424 and 425. During the bonding step 606, the solder material located between the electrical connection tabs 354 and the leads 362 is reflowed to form an electrical and mechanical connection therebetween. In one embodiment, the system controller 290 continuously monitors and tracks the temperature measured by the temperature sensors 450 as well as the amount of power applied to the elements 424 and 425 for the duration of the bonding step 606. The system controller 290 then compares a profile of the input power versus temperature obtained during the bonding step 606 to an expected profile of input power versus temperature for an established, acceptable bonding step 606. The system controller 290 then determines whether the bonding step was within desired parameters as provided by the comparison. In one embodiment, an expected power input for maintaining a bonding temperature of between about 300° C. and about 800° C. during the bonding step 606 may be between about 25 W and about 500 W for a duration of about 0.5 s and about 5 s. For example, an expected power input for maintaining a bonding temperature of between about 400° C. and about 500° C. during the bonding step 606 may be between about 300 W and about 400 W for a duration of about 2 s. If the actual power input during the bonding step 606 is outside of the expected parameters, the system controller 290 may indicate that a good solder bond was not achieved between the electrical connection tabs 354 of the junction box 370 and the leads 362 of the cross-buss 356. For example, if less than full contact exists between the elements 424, 425, the electrical connection tabs 354, and the leads 362, the elements 424, 425 may easily maintain an acceptable bonding temperature at significantly less power than expected, indicating that a good solder bond may not have been achieved between the electrical connection tabs 354 and the leads 362.

In a cool down step 608, electrical power to the heating elements 424, 425 is decreased or stopped in order to bring the temperature of the elements 424, 425 back down to the initial temperature as measured by the temperature sensors 450 coupled to the elements 424, 425. During the cool down step 608, the solder material between the leads 362 and the electrical connection tabs 354 is solidified and a robust mechanical and electrical connection therebetween is achieved. In one embodiment, the system controller 290 continuously monitors and tracks the temperature of the elements 424, 425 measured by the temperature sensors 450 as well as the amount of amount of power applied to the elements 424 and 425 during the cool down step 608. The system controller 290 then compares a profile of the input power versus temperature obtained during the cool down step 608 to an expected profile of input power versus temperature for an established, acceptable cool down step 608. The system controller 290 then determines whether the cool down step 608 was within desired parameters as provided by the comparison. In one embodiment, no power is input during reducing the temperature of the elements 424, 425 from a bonding temperature of between about 350° C. and about 800° C. back to the initial temperature of between about 50° C. and about 300° C. during the cool down step 608 for a duration of between about 0.1 s and about 2 s. If the actual power input during the heating step 604, bonding step 606, or the cool down step 608 is outside of the expected parameters or if the time duration is substantially outside of the expected parameters, the system controller 290 may indicate that a good solder bond was not achieved between the electrical connection tabs 354 of the junction box 370 and the leads 362 of the cross-buss 356.

After the cool down step 608 is substantially completed, the thermode assembly 423 is raised such that the heating elements 424 and 425 are clear from the electrical connection tabs 354 of the junction box 370 in a final positioning step 610. If the system controller indicates that a good solder bond was not formed between the electrical connection tabs 354 and the leads 362, the composite solar cell structure 304 may be removed from the junction box attachment module 238 for further analysis, rework, or scrap. Otherwise, the next step in the processing sequence 500 is performed.

Referring back to FIGS. 4A-4C and 5, in step 512, the internal region 365 of the junction box 370 is filled with a desired amount of a potting material by use of the dispense nozzle 427 disposed on the head assembly 406, the gantry system 405, conveyor system 401, and the system controller 290. The potting material, such as a polymeric material, is generally used to isolate active regions of the solar cell and the electrical connections formed during step 510 from environmental attack during the life of the formed solar cell device.

In step 514, the junction box lid is placed on the junction box 370 so that the internal region 365 of the junction box 370 can be further isolated from the external environment. In one embodiment, the lid retrieving robot 426 is configured to rotationally align the junction box lid 370A with respect to the composite solar cell structure 304 to properly angularly orient the junction box lid 370A with respect to the placement of the junction box 370. After completion of this processing sequence 500 the solar cell device is transferred to the device testing module 240 where step 140 can be performed.

While the foregoing is directed to embodiments of the present invention, other and further embodiments of the invention may be devised without departing from the basic scope thereof, and the scope thereof is determined by the claims that follow.

The invention claimed is:

1. A solder bonding method, comprising:
contacting an electrically conductive tab with a heating element, wherein the electrically conductive tab is in contact with an electrically conductive lead;
applying power to the heating element while monitoring the amount of power applied to the heating element;
measuring the temperature of the heating element during the applying power to the heating element; and
determining whether an acceptable bond is formed between the conductive tab and the conductive lead by comparing a profile of the monitored amount of power and the measured temperature with a profile of the expected amount of power and the expected temperature.

2. The method of claim 1, wherein measuring the temperature comprises continuously measuring the temperature during the applying power to the heating element.

3. The method of claim 2, wherein monitoring the amount of power comprises continuously monitoring the amount of power applied to the heating element.

4. The method of claim 3, wherein each of the profiles includes a heating phase comprising the amount of power required to raise the temperature of the heating element from an initial temperature to a bonding temperature.

5. The method of claim 4, wherein each of the profiles includes a bonding phase comprising the amount of power required to maintain the temperature of the heating element at the bonding temperature for a specified period of time.

6. The method of claim 3, further comprising supplying a flux material between the conductive tab and the heating element.

7. The method of claim 6, wherein the measuring the temperature of the heating element comprises monitoring a thermocouple coupled to the heating element near a tip of the heating element.

8. The method of claim 7, wherein the conductive tab is coupled to a junction box and the conductive lead is coupled to a thin film solar cell device.

9. A solar cell electrical connection module, comprising:
a vision system configured to scan a solar cell device and locate a lead on the solar cell device;
a robotic gripper having gripping elements configured to pick up, manipulate, and place a junction box onto the solar cell device such that a tab of the junction box is in contact with the lead using information received from the vision system;
a heating assembly comprising a heating element having a thermocouple attached thereto, wherein the heating element is configured to contact the tab; and
a controller configured to apply power to the heating element while monitoring the amount of power applied to the heating element, monitor temperature readings from the thermocouple while applying power, and compare the monitored amount of power and temperature readings with expected power and temperature to determine whether an acceptable bond is formed between the tab and lead.

10. The module of claim 9, further comprising a flux dispensing assembly having a nozzle positioned to apply a flux material to the tab on the junction box.

11. The module of claim 10, wherein the controller is further configured to monitor the amount of power applied to the heating element and temperature readings from the thermocouple during a heating phase during which the heating element is raised from an initial temperature to a bonding temperature and compare the monitored amount of power and time for achieving the bonding temperature with expected values.

12. The module of claim 11, wherein the controller is further configured to monitor the amount of power applied to the heating element and temperature readings from the thermocouple during a bonding phase during which the heating element is maintained at a bonding temperature for a specified period of time and compare the monitored amount of power for maintaining the bonding temperature to an expected value.

13. A method of attaching a junction box to a solar cell device, comprising:
applying an adhesive sealant to a sealing surface of a junction box;
picking up the junction box via a robotic gripper;
moving a solar cell device in a first direction via a conveyor device;
scanning the solar cell device with a vision system to locate exposed leads disposed on the solar cell device;
moving the junction box in a second direction via a head assembly and an actuator;
positioning the junction box onto the solar cell device such that electrical connection tabs within the junction box are in contact with the exposed electrical leads on the solar cell device using information provided by the vision system;
positioning heating elements having temperature sensors coupled thereto in contact with the tabs using information provided by the vision system;
applying power to the heating elements while monitoring the amount of power applied to the heating elements;
monitoring temperature readings from at least one of the temperature sensors; and
determining whether acceptable bonds are formed between the tabs and the leads by comparing a profile of the monitored amount of power and temperature with a profile of the expected amount of power and temperature.

14. The method of claim 13, further comprising applying flux to the tabs prior to positioning the junction box onto the solar cell device.

15. The method of claim 14, wherein each of the profiles includes a heating phase comprising the amount of power required to raise the temperature of the heating element from an initial temperature to a bonding temperature.

16. The method of claim 15, wherein each of the profiles includes a bonding phase comprising the amount of power required to maintain the temperature of the heating element at the bonding temperature for a specified period of time.

17. The method of claim 16, further comprising positioning a potting material dispensing nozzle in communication with an open region of the junction box using information provided by the vision system and dispensing the potting material to fill the junction box.

* * * * *